(12) United States Patent
Ma et al.

(10) Patent No.: US 11,933,842 B2
(45) Date of Patent: Mar. 19, 2024

(54) BOARD ADAPTER DEVICE, TEST METHOD, SYSTEM, APPARATUS, AND DEVICE, AND STORAGE MEDIUM

(71) Applicant: CHANGXIN MEMORY TECHNOLOGIES, INC., Hefei (CN)

(72) Inventors: Maosong Ma, Hefei (CN); Jin Qian, Hefei (CN); Jianbin Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 72 days.

(21) Appl. No.: 17/806,823

(22) Filed: Jun. 14, 2022

(65) Prior Publication Data
US 2023/0134661 A1     May 4, 2023

(30) Foreign Application Priority Data
Nov. 1, 2021 (CN) .......................... 202111282417.8

(51) Int. Cl.
*G01R 31/317* (2006.01)
*G01R 31/319* (2006.01)

(52) U.S. Cl.
CPC . *G01R 31/31717* (2013.01); *G01R 31/31721* (2013.01); *G01R 31/31908* (2013.01)

(58) Field of Classification Search
CPC ........ G01R 31/31717; G01R 31/31721; G01R 31/31905; G01R 31/31908; G11C 29/12005; G11C 29/1201; G11C 29/48
See application file for complete search history.

(56) References Cited

U.S. PATENT DOCUMENTS

| | | | |
|---|---|---|---|
| 6,351,827 B1* | 2/2002 | Co .................... | G11C 29/56016 714/29 |
| 10,510,432 B1* | 12/2019 | Shen ................ | G11C 29/56016 |
| 10,978,170 B2* | 4/2021 | Lee ........................ | G11C 29/00 |
| 11,735,232 B2* | 8/2023 | Cox ........................ | G11C 5/04 365/226 |
| 11,754,626 B1* | 9/2023 | Zhao .............. | G01R 31/318572 714/734 |

FOREIGN PATENT DOCUMENTS

CN            2938125 Y      8/2007

* cited by examiner

*Primary Examiner* — Vinh P Nguyen
(74) *Attorney, Agent, or Firm* — Syncoda LLC; Feng Ma

(57) ABSTRACT

A board adapter device includes: a first adapter structure provided with a gold finger matched with a board of a target memory module, a second adapter structure provided with a connector matched with the gold finger, and a signal transmission structure including a first and second transmission module. The first transmission module is for connecting a data signal line, a clock signal line, an address signal line, and a control signal line of the gold finger to corresponding connecting lines of the connector. The second transmission module is configured to, when receiving a power input signal, convert the power input signal into a power output signal matched with a power supply of the target memory module, and transmit the power output signal to a power signal line of the connector.

18 Claims, 13 Drawing Sheets

ABSTRACT: none visible

BOARD ADAPTER DEVICE, TEST METHOD, SYSTEM, APPARATUS, AND DEVICE, AND STORAGE MEDIUM

CROSS-REFERENCE TO RELATED APPLICATION

The present application claims priority to Chinese Patent Application No. 202111282417.8 filed on Nov. 1, 2021, the disclosure of which is hereby incorporated by reference in its entirety.

BACKGROUND

At present, there are relatively few methods for testing a memory module, and integrated circuit Automatic Test Equipment (ATE) or a Central Processing Unit (CPU) mainboard is usually used for testing. However, testing a memory module by a ATE or a CPU mainboard costs relatively much, and does not analyze problems of the memory module in practical applications accurately.

SUMMARY

The disclosure relates to the field of semiconductor testing, and provides a board adapter device, a test method, system, apparatus, and device, and a storage medium.

The technical solutions of the embodiments of the disclosure are implemented as follows.

An embodiment of the disclosure provides a board adapter device, which includes a first adapter structure, a second adapter structure, and a signal transmission structure.

The first adapter structure is provided with a gold finger matched with a board of a target memory module.

The second adapter structure is provided with a connector matched with the gold finger.

The signal transmission structure includes a first transmission module and a second transmission module. The first transmission module is configured to connect a data signal line, a clock signal line, an address signal line, and a control signal line of the gold finger to corresponding connecting lines of the connector. The second transmission module is configured to, when a power input signal is received, convert the power input signal into a power output signal matched with a power supply of the target memory module, and transmit the power output signal to a power signal line of the connector.

An embodiment of the disclosure provides a test method, which includes the following operations.

A data configuration board is controlled to be powered on when the gold finger of the board adapter device as described in any one of the above-mentioned embodiments is connected to a memory module connector of the data configuration board and the board adapter device receives a power input signal, the connector of the board adapter device being connected to a memory module to be tested.

A Dynamic Random Access Memory (DRAM) chip on the memory module is controlled to enter a test mode by the data configuration board through the board adapter device.

The memory module is tested by a target test platform when the DRAM chip on the memory module enters the test mode and the board adapter device connected to the memory module is hot-swapped from being connected to the memory module connector of the data configuration board to being connected to a memory module connector of the target test platform.

An embodiment of the disclosure provides a test system, which includes a memory module to be tested, a board adapter device as described in any one of the above-mentioned embodiments, a data configuration board, and a target test platform.

The memory module to be tested is connected to the connector of the board adapter device.

The data configuration board is configured to control, through the board adapter device, a DRAM chip on the memory module to enter a test mode when the gold finger of the board adapter device is connected to a memory module connector of the data configuration board, the board adapter device receives a power input signal and the data configuration board is powered on.

The target test platform is configured to test the memory module when the DRAM chip on the memory module enters the test mode and the board adapter device connected to the memory module is hot-swapped from being connected to the memory module connector of the data configuration board to being connected to a memory module connector of the target test platform.

An embodiment of the disclosure provides a test apparatus, which includes a power-on module, a control module, and a test module.

The power-on module is configured to control a data configuration board to be powered on when the gold finger of the board adapter device as described in any one of the above-mentioned embodiments is connected to a memory module connector of the data configuration board and the board adapter device receives a power input signal, the connector of the board adapter device being connected to a memory module to be tested.

The control module is configured to control, by the data configuration board through the board adapter device, a DRAM chip on the memory module to enter a test mode.

The test module is configured to test, by a target test platform, the memory module when the DRAM chip on the memory module enters the test mode and the board adapter device connected to the memory module is hot-swapped from being connected to the memory module connector of the data configuration board to being connected to a memory module connector of the target test platform.

An embodiment of the disclosure provides a test device, which includes a memory and a processor. The memory is configured to store a computer program executable by the processor. The processor is configured to execute the computer program to perform part or all of the steps in the method.

An embodiment of the disclosure provides a non-transitory computer-readable storage medium having stored thereon a computer program, that, when executed by a processor, causes the processor to perform part or all of the steps in the method.

Details of one or more embodiments of the disclosure are set forth in the accompanying drawings and description below. Other features and advantages of the disclosure will become apparent from the specification and the drawings.

BRIEF DESCRIPTION OF THE DRAWINGS

In order to describe the technical solutions of the embodiments of the disclosure more clearly, the drawings required to be used in the embodiments will be simply introduced below. It is apparent that the drawings described below are merely some embodiments of the disclosure. Other drawings may further be obtained by those of ordinary skill in the art according to these drawings without creative work.

DETAILED DESCRIPTION

Figure 1A:
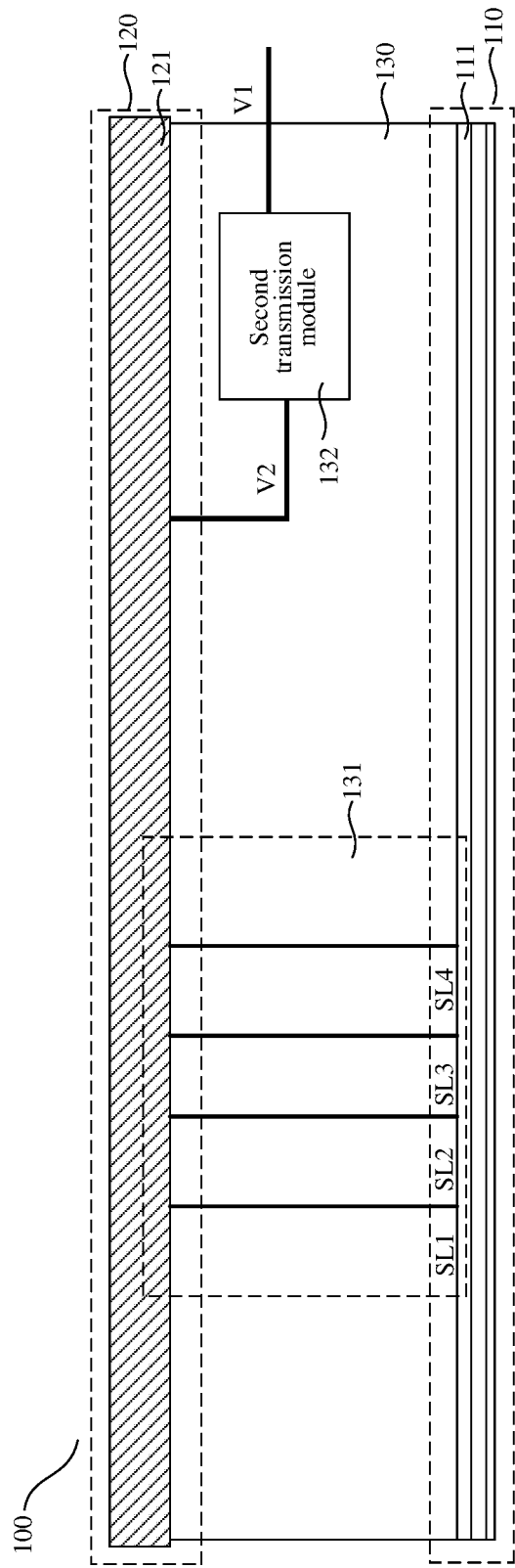
FIG. 1A is a schematic diagram of a composition structure of a board adapter device according to an embodiment of the disclosure.

The technical solutions of the disclosure will further be described below in detail in combination with the drawings and embodiments. The described embodiments should not be considered as limiting the disclosure. All other embodiments obtained by those of ordinary skill in the art without creative work shall fall within the scope of protection of the disclosure.

In the following descriptions, reference is made to "some embodiments" which describes a subset of all possible embodiments. However, it can be understood that "some embodiments" may be the same or different subsets of all the possible embodiments and may be combined without conflict.

In the following descriptions, terms "first/second/third" are used only to distinguish similar objects and do not represent a specific sequence of objects. It can be understood that "first/second/third" may be interchanged in a specific sequence or order where it is allowed, so that embodiments of the disclosure described herein can be implemented in a sequence other than that illustrated or described herein.

Unless otherwise defined, all technical and scientific terms used herein have the same meanings as commonly understood by those skilled in the art belonging to the disclosure. The terms used herein are only for the purpose of describing the disclosure and are not intended to limit the disclosure.

In some implementations, a memory module generally includes at least one DRAM chip. A test logic may be introduced into the DRAM chip by Design For Test (DFT) in a chip design process, and this test logic is used to complete the automatic production of a test vector, thereby allowing for fast and efficient chip testing. After the tape-out of the DRAM chip, an engineer can access a DFT signal defined in a design phase in a test mode of the DRAM chip. The DFT signal is stored in a DFT register of the DRAM chip. A value of the DFT signal in the DFT register may be modified to modify a partial power voltage, Input/Output (I/O) timing, etc., in the DRAM chip, thereby implementing efficient debugging and accelerating error locating, and enable the entire DRAM chip test process to converge rapidly.

Entering the test mode of the DRAM chip may include entering through ATE and entering through a CPU mainboard. However, the two manners at least have the following problems.

1) When the test mode of the DRAM chip is entered through ATE or a specific CPU mainboard, the DRAM chip may be tested only in an independent experimental environment rather than a system platform where a memory module including the DRAM chip is practically installed and used, and a real signal property in the system platform may not be simulated. As a result, accuracy of the test is affected, and problems of the memory module in practical applications may not be analyzed accurately.

2) After the test mode of the DRAM chip is entered, modifications made to voltage power, I/O timing, etc., previously in the test mode may be lost in case of power-off or reset.

3) When the test mode of the DRAM chip is entered through a CPU mainboard, it requires clear and complete underlying codes of the CPU mainboard and the correctly modification of the physical-layer control codes of the DRAM, which costs relatively much and is non-universal.

In view of this, an embodiment of the disclosure provides a board adapter device, which can improve the flexibility and accuracy of testing a memory module and facilitate the testing of the memory module in various types of client system platforms. FIG. 1A is a schematic diagram of a composition structure of a board adapter device according to an embodiment of the disclosure. As shown in FIG. 1A, the board adapter device 100 includes a first adapter structure 110, a second adapter structure 120, and a signal transmission structure 130.

The first adapter structure 110 is provided with a gold finger 111 matched with a board of a target memory module.

The second adapter structure 120 is provided with a connector 121 matched with the gold finger 111.

The signal transmission structure 130 includes a first transmission module 131 and a second transmission module 12. The first transmission module 131 is configured to connect a data signal line SL1, a clock signal line SL2, an address signal line SL3, and a control signal line SL4 of the gold finger 111 to corresponding connecting lines of the connector 121. The second transmission module 132 is configured to, when a power input signal V1 is connected, convert the power input signal V1 into a power output signal V2 matched with a power supply of the target memory module, and transmit the power output signal V2 to a power signal line of the connector 121.

Figure 1B:
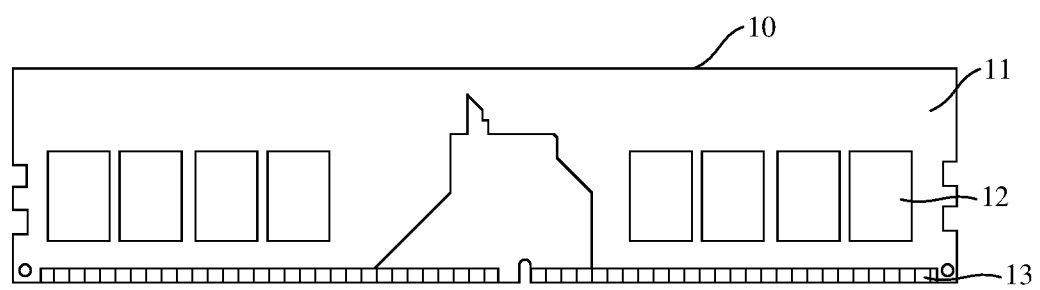
FIG. 1B is a schematic diagram of a hardware structure of a DIMM according to an embodiment of the disclosure.

Here, the target memory module may be any suitable memory module, including, but not limited to, one or more of a Dual Inline Memory Module (DIMM), a Single In-line Memory Module (SIMM), or the like. The DIMM may be a Small Outline DIMM (SODIMM), an Unbuffered DIMM (UDIMM), or a Registered DIMM (RDIMM), etc. No limits are made herein. FIG. 1B is a schematic diagram of a hardware structure of a DIMM according to an embodiment of the disclosure. As shown in FIG. 1B, the DIMM 10 includes a board 11, multiple DRAM chips 12 welded to the board 11, and a gold finger 13 at an end of the board 11.

That the gold finger 111 in the first adapter structure 110 is matched with the board of the target memory module refers to that signal lines of the gold finger 111 are in one-to-one correspondence with and the same in number as signal lines of a gold finger end on the board of the target memory module. By means of the gold finger 111, the board adapter device 100 may be connected to any suitable connector adapted to the board of the target memory module by plugging-in, direct connection, or the like. The connector adapted to the board of the target memory module may include a DIMM slot, an SIMM slot, etc. During implementation, the first adapter structure 110 may be any suitable circuit structure with a gold finger. No limits are made thereto in the embodiment of the disclosure.

That the connector 121 in the second adapter structure 120 is matched with the gold finger 111 refers to that signals lines of the connector 121 are in one-to-one correspondence with and the same in number as the signal lines of the gold finger 111. By means of the connector 121, the board adapter device 100 may be connected to the board of the target memory module by plugging-in, direct connection, or the like. During implementation, the connector 111 may be a slot-type connector, or a magnetic connector. No limits are made herein. The second adapter structure 120 may be any suitable circuit structure with a connector. No limits are made thereto in the embodiment of the disclosure.

The signal transmission structure 130 may include the first transmission module 131 and the second transmission module 132. The first transmission module 131 may connect the data signal line, the clock signal line, the address signal line, and the control signal lines of the gold finger 111 to a data signal line, a clock signal line, an address signal line, and a control signal line of the connector 121 in one-to-one correspondence. During implementation, the corresponding signal lines of the gold finger 111 and the connector 121 may be connected through cables or circuit boards. No limits are made herein.

The second transmission module 132 may be provided with an input interface, configured to connect the power input signal V1. The second transmission module 132 converts the input power input signal V1 into the power output signal V2 matched with the power supply of the target memory module, and transmits the power output signal V2 to the power signal line of the connector 121. The power supply of the target memory module may be determined according to a specification of a practical memory module. For example, for a DIMM, the power supply may include a power supply voltage signal VDD, a programmable voltage signal VPP, and a termination voltage signal VTT. A voltage of the power supply voltage signal VDD may be 1.2 Volt (V)±10%. A voltage of the programmable voltage signal VPP may be 2.5V±10%. A voltage of the termination voltage signal VTT may be 0.6V±10%. For another example, for an SIMM, the power supply may include a power supply voltage signal VCC, and a voltage of the power supply voltage signal VCC may be 5V±10%. The power input signal V1 may be a DC power signal, or an alternating-current (AC) power signal. During implementation, those skilled in the art may use a suitable power conversion mode according to an actual situation to convert the input power input signal V1 into the power output signal V2 matched with the power supply of the target memory module. No limits are made herein.

In the embodiment of the disclosure, the board adapter device includes the first adapter structure, the second adapter structure, and the signal transmission structure. The first adapter structure is provided with the gold finger matched with the board of the target memory module. The second adapter structure is provided with the connector matched with the gold finger. The data signal line, the clock signal line, the address signal line, and the control signal line of the gold finger are connected to the corresponding connecting lines of the connector. The power signal line of the connector is connected to the connected power input signal through the second transmission module in the signal transmission structure. As such, a power signal of the memory module may be controlled independently without affecting communications between the board of the memory module and an existing slot. Therefore, the board adapter device may support the hot-swapping of the memory module for connection with different boards or hardware platforms and further enable a configuration of the memory module not to be lost during swapping for connection, thus improving the flexibility and accuracy of testing the memory module, and facilitating the test of the memory module on various types of system platforms.

In some embodiments, at least one of a power signal line of the gold finger 111 or a reset signal line of the gold finger is floating. Here, the power signal line and reset signal line of the gold finger 111 correspond to a power signal line and reset signal line at the gold finger end on the board of the target memory module, respectively. During implementation, at least one of the power signal line or reset signal line of the gold finger 111 may be floating according to an actual situation. As such, the influence of at least one of: a power signal, a reset signal of the gold finger on a power signal, or a reset signal of the connector may be reduced.

Figure 1C:
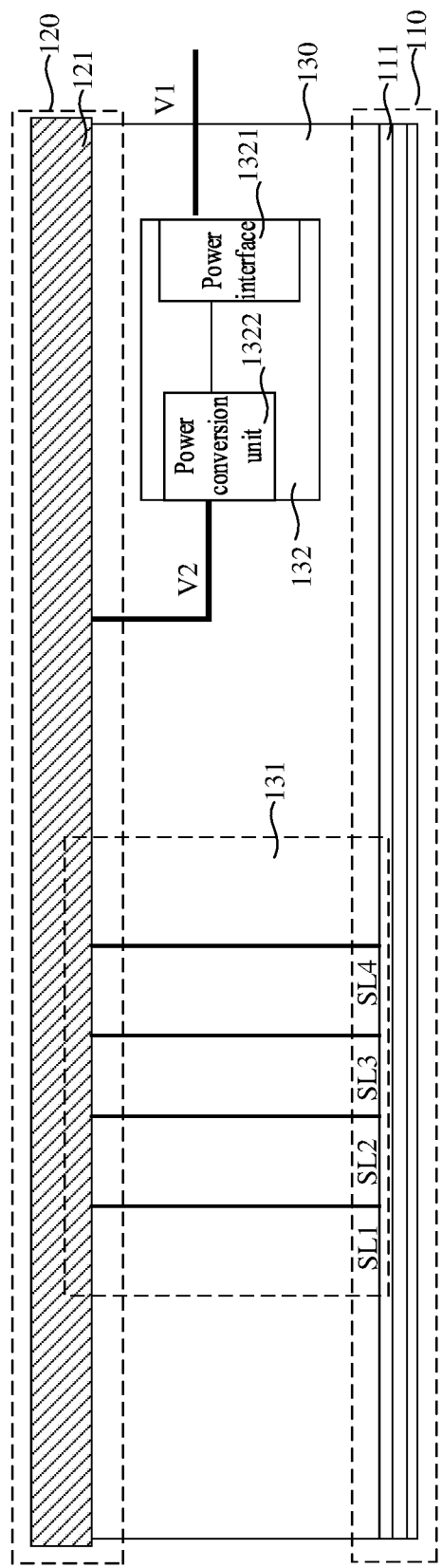
FIG. 1C is a schematic diagram of a composition structure of a board adapter device according to an embodiment of the disclosure.

In some embodiments, as shown in FIG. 1C, the second transmission module 132 includes a power interface 1321 and a power conversion unit 1322. The power interface 1321 is configured to be connected to an external power supply, and transmit the power input signal V1 of the external power supply to the power conversion unit 1322. The power conversion unit 1322 is connected to the power interface 1321 and the power signal line of the connector 121, and is configured to convert the power input signal V1 into the power output signal V2 matched with the power supply of the target memory module, and transmit the power output signal V2 to the power signal line of the connector 121. During implementation, the power conversion unit may be a power conversion chip, such as a current conversion chip, a voltage conversion chip, or the like. The power conversion unit may also be a power conversion circuit, such as a current conversion circuit, a voltage conversion circuit, or the like. Therefore, by means of the power conversion unit, the power input signal of the external power supply may be converted into the power output signal matched with the power supply of the target memory module simply and rapidly.

In some embodiments, the power output signal includes a power supply voltage signal, a programmable voltage signal, and a termination voltage signal. The second transmission module 132 is configured to transmit the power supply voltage signal, the programmable voltage signal, and the termination voltage signal to a power supply voltage signal line, a programmable voltage signal line, and a termination voltage signal line of the connector 121, respectively. Therefore, various voltage signals matched with the power supply of the target memory module may be obtained simply and rapidly.

In some embodiments, the signal transmission structure further includes a third transmission unit, connected to a reset signal line of the connector and configured to generate a power-on reset signal, and transmit the power-on reset signal to the reset signal line. As such, the reset signal line of the connector may be controlled independently. Therefore, the influence of a power-on reset signal received by the gold finger in the first adapter structure on a power-on reset signal of the connector in the second adapter structure may be reduced during the swapping of the target memory module for connection with different system platforms based on the board adapter device.

In some embodiments, the third transmission unit includes a reset circuit, configured to generate the power-on reset signal. Therefore, by means of the reset circuit, the power-on reset signal may be generated simply and rapidly.

In some embodiments, the reset circuit includes at least one of a resistance-capacitance reset circuit or a reset chip. Therefore, the complexity of the reset circuit may further be reduced, and the stability of the reset signal may be improved.

In some embodiments, the memory module is a DIMM. Therefore, the hot-swapping of the DIMM for connection with different boards or hardware platforms may be supported, and a configuration of the DIMM may not be lost during swapping for connection, thus improving the flexibility and accuracy of testing the DIMM, and facilitating the test of the DIMM on various types of system platforms.

Figure 2:
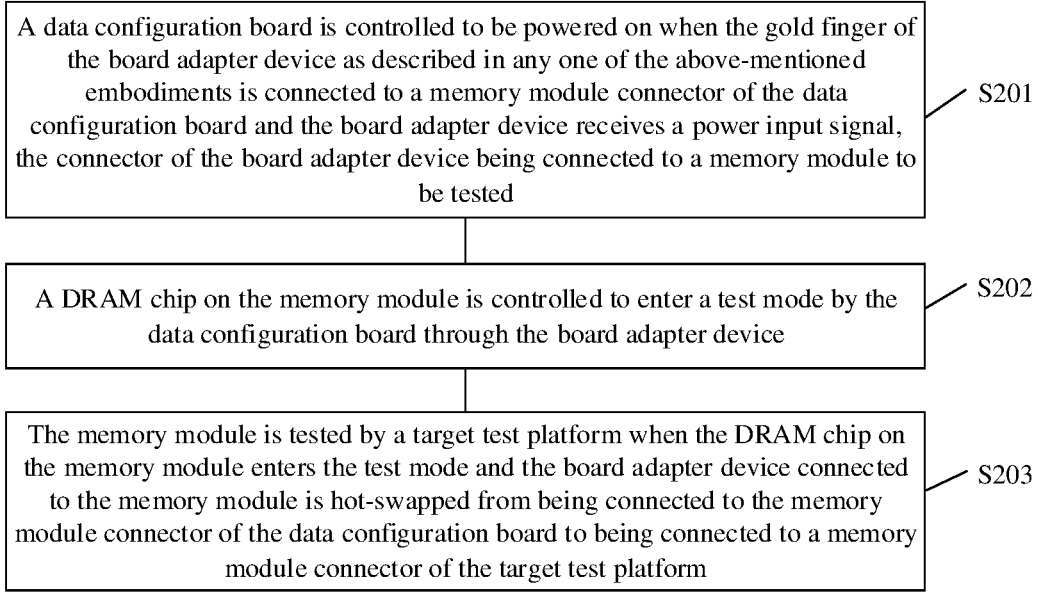
FIG. 2 is a flowchart for implementing a test method according to an embodiment of the disclosure.

Based on the board adapter device in the above-mentioned embodiments, an embodiment of the disclosure provides a test method, which may be executed by a processor of a test device. The test device may refer to any suitable device with data processing capabilities, such as a server, a notebook computer, a tablet computer, a desktop computer, an intelligent control device, and test equipment. FIG. 2 is a flowchart for implementing a test method according to an embodiment of the disclosure. As shown in FIG. 2, the method includes the following operations S201 to S203.

In S201, a data configuration board is controlled to be powered on when the gold finger of the board adapter device as described in any one of the above-mentioned embodiments is connected to a memory module connector of the data configuration board and the board adapter device receives a power input signal, the connector of the board adapter device being connected to a memory module to be tested.

Here, the memory module to be tested may be a DIMM, or an SIMM. No limits are made herein.

The data configuration board may be any suitable board capable of modifying a physical-layer control code of a memory module through a memory module connector. The memory module connector of the data configuration board may be any suitable connector matched with a gold finger of the memory module to be tested. No limits are made herein. The data configuration board may modify a physical-layer control code of the memory module to control the DRAM chip on the memory module to enter a test mode. For example, when the memory module to be tested is a DIMM, the memory module connector may be a DIMM slot, the data configuration board may be a Field Programmable Gate Array (FPGA) board or Complex Programmable Logic Device (CPLD) board with a DIMM slot, and a control program for modifying the physical-layer control code of the memory module, such as a Register-Transfer Level (RTL) code, may be written in an FPGA chip on the FPGA board or a CPLD chip on the CPLD board.

The connection between the gold finger of the board adapter device and the memory module connector of the data configuration board may be made manually by a user or an engineer, or automatically by test equipment, an intelligent control device, etc. No limits are made herein.

In S202, a DRAM chip on the memory module is controlled to enter a test mode by the data configuration board through the board adapter device.

Here, in some implementation modes, a written control program for controlling the DRAM chip to enter the test mode may be imported into the data configuration board in advance, and the physical-layer control code of the memory module is modified based on the control program to control the DRAM chip on the memory module to enter the test mode.

In some implementation modes, a control program for controlling the DRAM chip to enter the test mode may be written in the data configuration board, and the data configuration board may modify the physical-layer control code of the memory module based on the written control program to control the DRAM chip on the memory module to enter the test mode.

During implementation, the control program for controlling the DRAM chip to enter the test mode may be determined by those skilled in the art based on a practical specification of the DRAM chip on the memory module to be tested. No limits are made thereto in the embodiment of the disclosure.

In S203, the memory module is tested by a target test platform when the DRAM chip on the memory module enters the test mode and the board adapter device connected to the memory module is hot-swapped from being connected to the memory module connector of the data configuration board to being connected to a memory module connector of the target test platform.

Here, the target test platform may be a system platform configured to perform product debugging on the memory module, or a system platform where the memory module is practically installed and used.

When the DRAM chip on the memory module enters the test mode, the memory module and board adapter device that are connected together are hot-removed from the data configuration board together and then connected to the memory module connector of the target test platform. During implementation, the board adapter device connected to the memory module may be hot-swapped manually by the user or the engineer from being connected to the memory module connector of the data configuration board to being connected to the memory module connector of the target test platform. Alternatively, the board adapter device connected to the memory module may be hot-swapped automatically by the test equipment, the intelligent control device, etc., from being connected to the memory module connector of the data configuration board to being connected to the memory module connector of the target test platform. No limits are made herein. For example, when the memory module is a DIMM, the data configuration board is an FPGA/CPLD board with a DIMM slot, and the target test platform is a system platform with a DIMM slot, the board adapter device plugged with the DIMM may be hot-unplugged from the DIMM slot of the FPGA/CPLD board and then plugged into the DIMM slot of the target test platform, and the target test platform is used to test the DIMM.

In some embodiments, the memory module is a DIMM.

In some embodiments, the data configuration board includes one of an FPGA board and a CPLD board. This allows the DRAM chip on the memory module to be controlled to enter the test mode through the FPGA/CPLD board, which is user-friendly and less expensive to implement, and enable to improve wide application of the test method.

In the embodiment of the disclosure, by the data configuration board, the DRAM chip on the memory module to be tested is controlled through the board adapter device to enter the test mode, and then the memory module and the board adapter device are hot-swapped to be connected to the memory module connector of the target test platform, and the target test platform is used to test the memory module. In this manner, the memory module is kept on when being swapped from being connected to the data configuration board to being connected to the target test platform, so that a modification made by the data configuration board to the physical-layer control code of the memory module may not be lost during swapping for connection, and the test mode may be continued after connection to the target test platform. As such, the memory module may be tested in the target test platform through the test mode of the DRAM chip on the memory module, thus improving the flexibility and accuracy of testing the memory module, and facilitating the test of the memory module on various types of system platforms.

Figure 3:
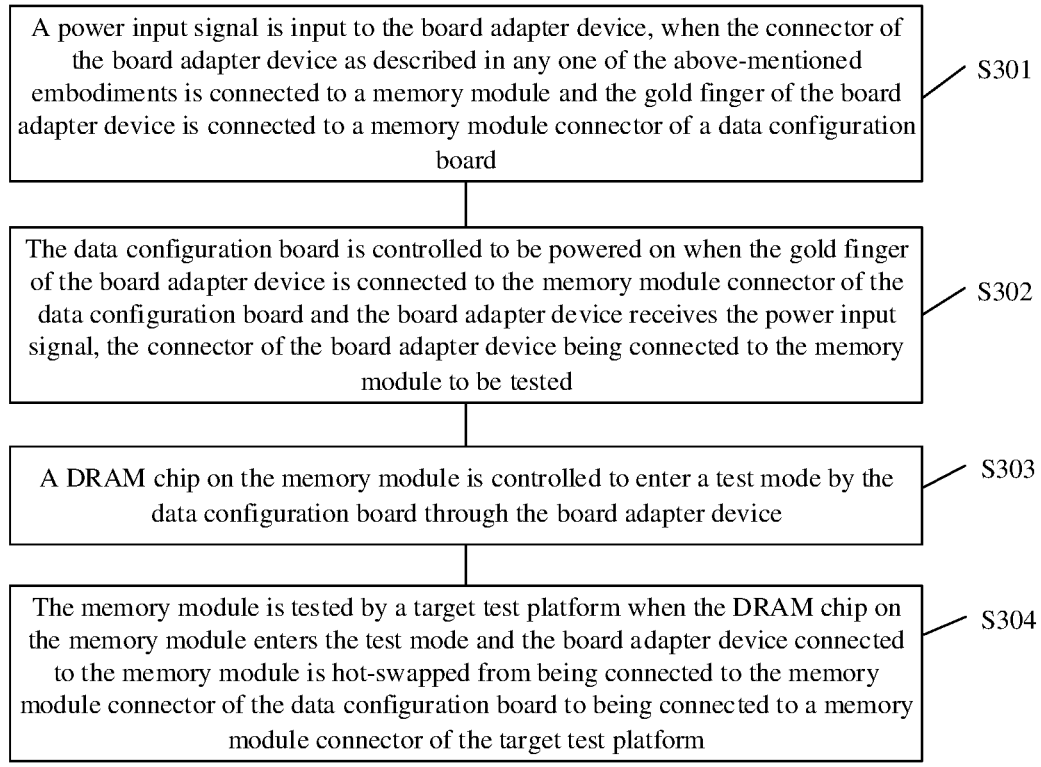
FIG. 3 is a flowchart for implementing a test method according to an embodiment of the disclosure.

An embodiment of the disclosure provides a test method, which may be executed by a processor of a test device. FIG. 3 is a flowchart for implementing a test method according to an embodiment of the disclosure. As shown in FIG. 3, the method includes the following operations S301 to S304.

In S301, a power input signal is input to the board adapter device, when the connector of the board adapter device as described in any one of the above-mentioned embodiments is connected to a memory module and the gold finger of the board adapter device is connected to a memory module connector of a data configuration board.

Here, the power input signal input to the board adapter device may be a current signal or a voltage signal, and may be a DC signal or an AC signal. During implementation, those skilled in the art may input a suitable power input signal to the board adapter device according to an actual situation. No limits are made herein.

In S302, the data configuration board is controlled to be powered on when the gold finger of the board adapter device is connected to the memory module connector of the data configuration board and the board adapter device receives the power input signal, the connector of the board adapter device being connected to the memory module to be tested.

In S303, a DRAM chip on the memory module is controlled to enter a test mode by the data configuration board through the board adapter device.

In S304, the memory module is tested by a target test platform when the DRAM chip on the memory module enters the test mode and the board adapter device connected to the memory module is hot-swapped from being connected to the memory module connector of the data configuration board to being connected to a memory module connector of the target test platform.

Here, S302 to S304 correspond to S201 to S203 in the above-mentioned embodiment respectively, and may be implemented with reference to specific implementation modes of S201 to S203.

In some embodiments, the operation in S301 that the power input signal is input to the board adapter device may include the following operation. In S311, the second transmission structure of the board adapter device is connected to a DC power supply providing a preset voltage value. Here, the second transmission structure may be connected to the DC power supply in any suitable manner such as connecting through an interface and direct connecting through a cable. The preset voltage value may be determined according to an actual situation. For example, the preset voltage value may be a 5V DC voltage.

In the embodiment of the disclosure, the power input signal may be input automatically to the board adapter device when the connector of the board adapter device is connected to the memory module and the gold finger of the board adapter device is connected to the memory module connector of the data configuration board, thus allowing for increased automation in the test process.

Figure 4:
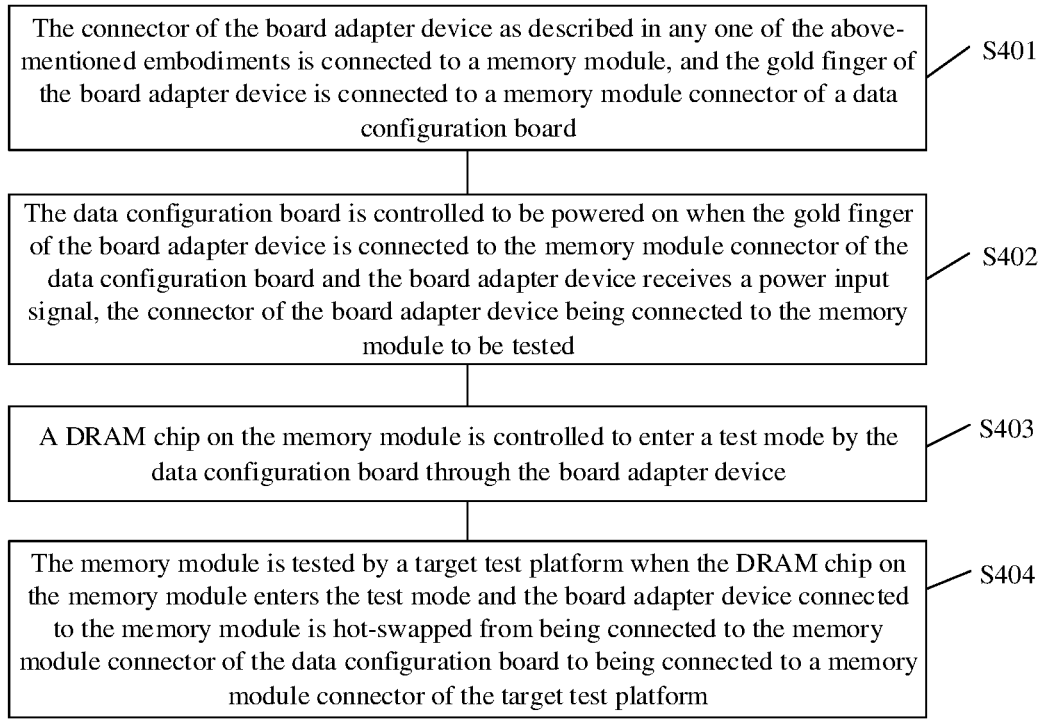
FIG. 4 is a flowchart for implementing a test method according to an embodiment of the disclosure.

An embodiment of the disclosure provides a test method, which may be executed by a processor of a test device. FIG. 4 is a flowchart for implementing a test method according to an embodiment of the disclosure. As shown in FIG. 4, the method includes the following operations S401 to S404.

In S401, the connector of the board adapter device as described in any one of the above-mentioned embodiments is connected to a memory module, and the gold finger of the board adapter device is connected to a memory module connector of a data configuration board.

Here, test equipment, an intelligent control device, etc., may be used to automatically connect the connector of the board adapter device with the memory module and connect the gold finger of the board adapter device with the memory module connector of the data configuration board.

In S402, the data configuration board is controlled to be powered on when the gold finger of the board adapter device is connected to the memory module connector of the data configuration board and the board adapter device receives a power input signal, the connector of the board adapter device being connected to the memory module to be tested.

In S403, a DRAM chip on the memory module is controlled to enter a test mode by the data configuration board through the board adapter device.

In S404, the memory module is tested by a target test platform when the DRAM chip on the memory module enters the test mode and the board adapter device connected to the memory module is hot-swapped from being connected to the memory module connector of the data configuration board to being connected to a memory module connector of the target test platform.

Here, S402 to S404 correspond to S201 to S203 in the above-mentioned embodiment respectively, and may be implemented with reference to specific implementation modes of S201 to S203.

In the embodiment of the disclosure, the memory module, the board adapter device, and the data configuration board may be connected automatically, thus allowing for increased automation in the test process.

Figure 5:
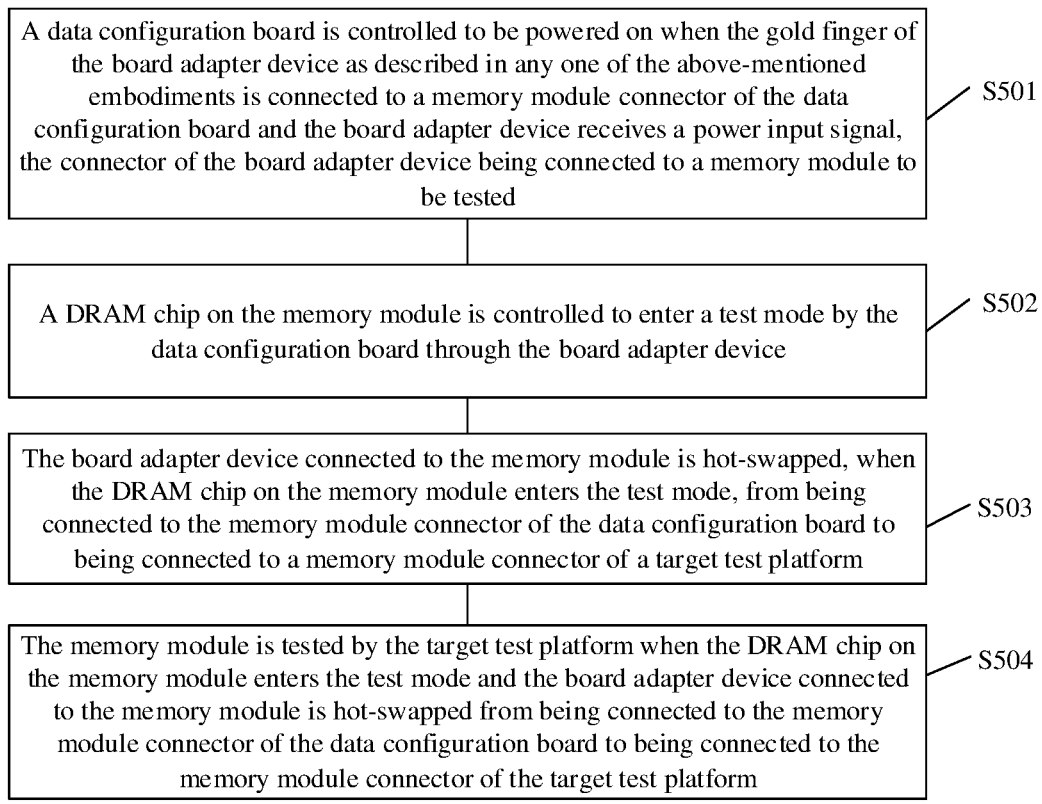
FIG. 5 is a flowchart for implementing a test method according to an embodiment of the disclosure.

An embodiment of the disclosure provides a test method, which may be executed by a processor of a test device. FIG. 5 is a flowchart for implementing a test method according to an embodiment of the disclosure. As shown in FIG. 5, the method includes the following operations S501 to S504.

In S501, a data configuration board is controlled to be powered on when the gold finger of the board adapter device as described in any one of the above-mentioned embodiments is connected to a memory module connector of the data configuration board and the board adapter device receives a power input signal, the connector of the board adapter device being connected to a memory module to be tested.

In S502, a DRAM chip on the memory module is controlled to enter a test mode by the data configuration board through the board adapter device.

Here, S501 to S502 correspond to S201 to S202 in the above-mentioned embodiment respectively, and may be implemented with reference to specific implementation modes of S201 to S202.

In S503, the board adapter device connected to the memory module is hot-swapped, when the DRAM chip on the memory module enters the test mode, from being connected to the memory module connector of the data configuration board to being connected to a memory module connector of a target test platform.

Here, the board adapter device connected to the memory module may be hot-swapped automatically by test equipment, an intelligent control device, etc., from being connected to the memory module connector of the data configuration board to being connected to the memory module connector of the target test platform. The memory module is kept on during swapping. For example, a mechanical arm of the test equipment may be controlled to hot-unplug the board adapter device connected to a DIMM from a DIMM slot of the data configuration board and hot-plug the unplugged board adapter device connected to the DIMM into a DIMM slot of the target test platform.

In S504, the memory module is tested by the target test platform when the DRAM chip on the memory module enters the test mode and the board adapter device connected to the memory module is hot-swapped from being connected to the memory module connector of the data configuration board to being connected to the memory module connector of the target test platform.

Here, S504 corresponds to S203 in the above-mentioned embodiment, and may be implemented with reference to a specific implementation mode of S203.

In the embodiment of the disclosure, the board adapter device connected to the memory module may be hot-swapped automatically, when the DRAM chip on the memory module enters the test mode, from being connected to the memory module connector of the data configuration board to being connected to the memory module connector of the target test platform. Therefore, a test process may be more automatic.

Figure 6:
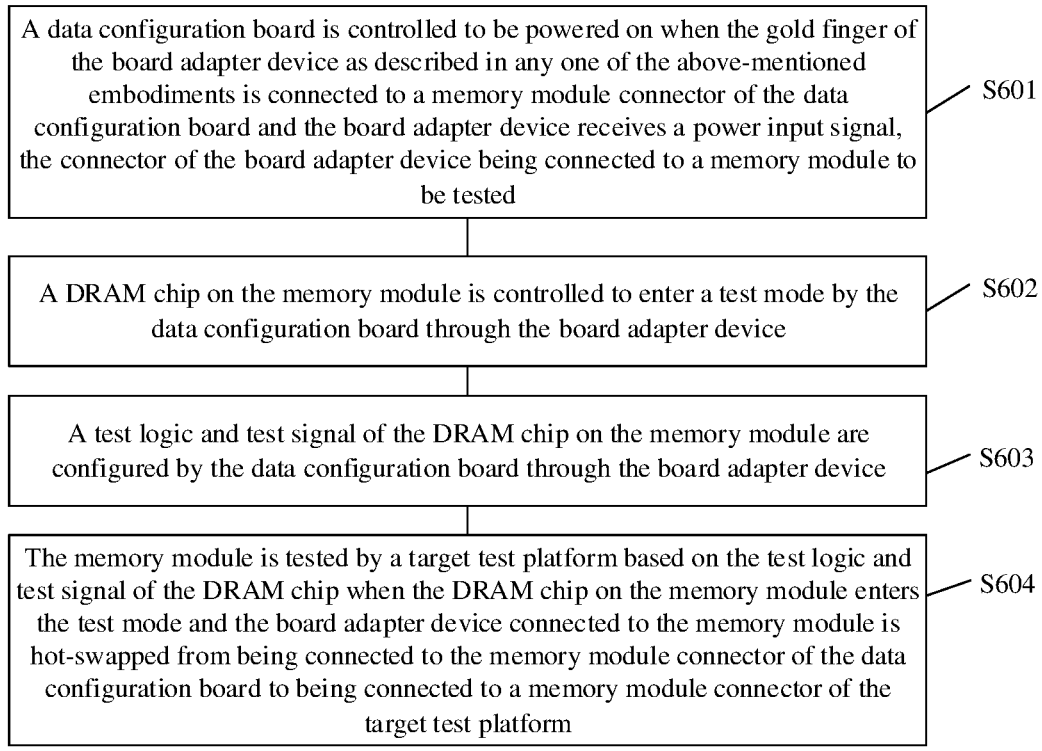
FIG. 6 is a flowchart for implementing a test method according to an embodiment of the disclosure.

An embodiment of the disclosure provides a test method, which may be executed by a processor of a test device. FIG. 6 is a flowchart for implementing a test method according to an embodiment of the disclosure. As shown in FIG. 6, the method includes the following operations S601 to S604.

In S601, a data configuration board is controlled to be powered on when the gold finger of the board adapter device as described in any one of the above-mentioned embodiments is connected to a memory module connector of the data configuration board and the board adapter device receives a power input signal, the connector of the board adapter device being connected to a memory module to be tested.

In S602, a DRAM chip on the memory module is controlled to enter a test mode by the data configuration board through the board adapter device.

Here, S601 to S602 correspond to S201 to S202 in the above-mentioned embodiment respectively, and may be implemented with reference to specific implementation modes of S201 to S202.

In S603, a test logic and test signal of the DRAM chip on the memory module are configured by the data configuration board through the board adapter device.

Here, the data configuration board may modify a value in a DFT register in the DRAM chip on the memory module through the board adapter device to affect a behavior of a DRAM circuit, thereby implementing the configuration of the test logic and test signal of the DRAM chip. The configured test logic and test signal may be determined according to a practical test requirement. No limits are made thereto in the embodiment of the disclosure. For example, a value in a DFT register 1 may be modified from 0x2A to 0x3B.

In some implementation modes, a written configuration program for configuring the test logic and test signal of the DRAM chip may be imported into the data configuration board in advance, and a value in a DFT register in the DRAM chip on the memory module is modified based on the configuration program to implement the configuration of the test logic and test signal of the DRAM chip.

In some implementation modes, a configuration program for configuring the test logic and test signal of the DRAM chip may be written in the data configuration board, and the data configuration board may modify a value in a DFT register in the DRAM chip on the memory module based on the written configuration program to implement the configuration of the test logic and test signal of the DRAM chip.

During implementation, the configuration program for configuring the test logic and test signal of the DRAM chip may be determined by those skilled in the art based on a practical specification of the DRAM chip on the memory module to be tested as well as a practical test requirement. No limits are made thereto in the embodiment of the disclosure.

In S604, the memory module is tested by a target test platform based on the test logic and test signal of the DRAM chip when the DRAM chip on the memory module enters the test mode and the board adapter device connected to the memory module is hot-swapped from being connected to the memory module connector of the data configuration board to being connected to a memory module connector of the target test platform.

In the embodiment of the disclosure, the test logic and test signal of the DRAM chip on the memory module are configured by the data configuration board, and the memory module is tested by the target test platform based on the test logic and test signal of the DRAM chip. Therefore, the flexibility of testing the memory module may further be improved to meet various test requirements.

An exemplary application of the embodiment of the disclosure in a practical application scenario will be described below by taking the testing of a DIMM as an example.

Figure 7A:
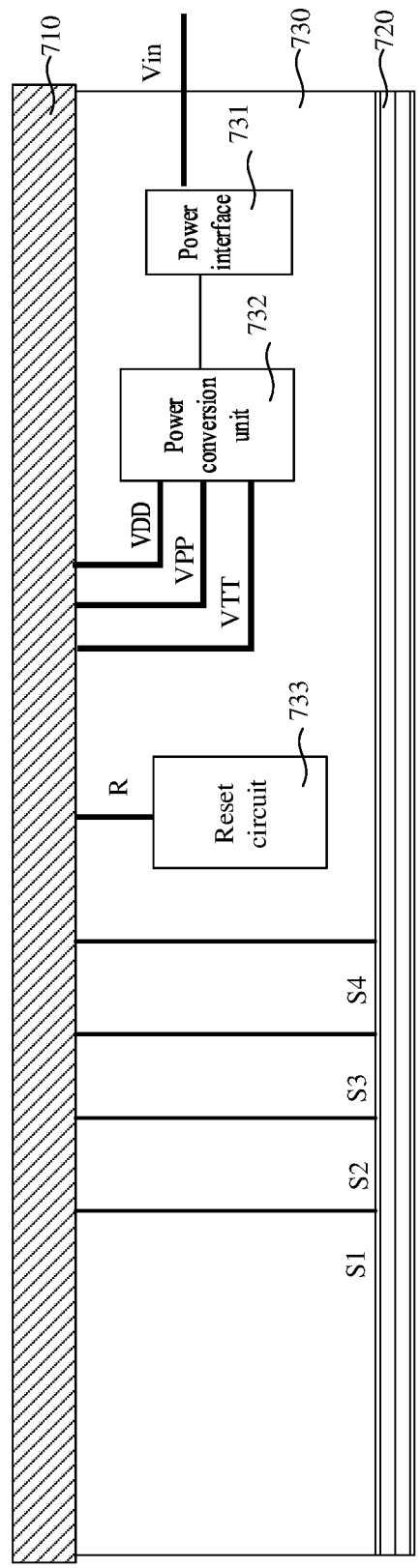
FIG. 7A is a schematic diagram of a composition structure of a DIMM adapter board according to an embodiment of the disclosure.

An embodiment of the disclosure provides a DIMM adapter board. As shown in FIG. 7A, the DIMM adapter board 700 includes a DIMM connector 700, a DIMM gold finger 720, and a circuit board 730 connected to the DIMM connector 710 and the DIMM gold finger 720.

The circuit board 730 directly connects all of a data signal S1, a clock signal S2, an address signal S3, and a control signal S4 on the DIMM gold finger 720 to corresponding signal lines of the DIMM connector 710.

The circuit board 730 includes a power interface 731 and a power conversion unit 732. The DIMM adapter board 700 is connected to an external 5V DC power Vin through the power interface 731, and converts, through the power conversion unit 732, the 5V DC power Vin into three sets of power VDD, VPP, and VTT that are matched with the DIMM, and connects the three sets of power VDD, VPP, and VTT to corresponding power signal lines of the DIMM connector 710 respectively. Power signal lines on the DIMM gold finger 720 corresponding to the three sets of power VDD, VPP, and VTT are floating.

The circuit board 730 further includes a reset circuit 733, configured to generate a power-on reset signal R, and connect the generated power-on reset signal R to a reset signal line of the DIMM connector 710. A reset signal line on the DIMM gold finger 720 is floating.

It is to be noted that, during implementation, the DIMM adapter board may be implemented as the board adapter device in the above-mentioned embodiments. The DIMM connector may correspond to the second adapter structure in the above-mentioned embodiments. The DIMM gold finger may correspond to the first adapter structure in the above-mentioned embodiments. The circuit board connected to the DIMM connector and the DIMM gold finger may correspond to the signal transmission structure in the above-mentioned embodiments.

Based on the DIMM adapter board provided in the above-mentioned embodiment of the disclosure, an embodiment of the disclosure provides a test method. According to the method, the test mode of the DRAM chip is introduced into a solution for testing a DIMM. An RTL code is written by an external FPGA/CPLD board to control the DRAM on the DIMM. When the DRAM enters a test mode, the DIMM is installed in a target test platform, and is tested by the target test platform.

Figure 7B:
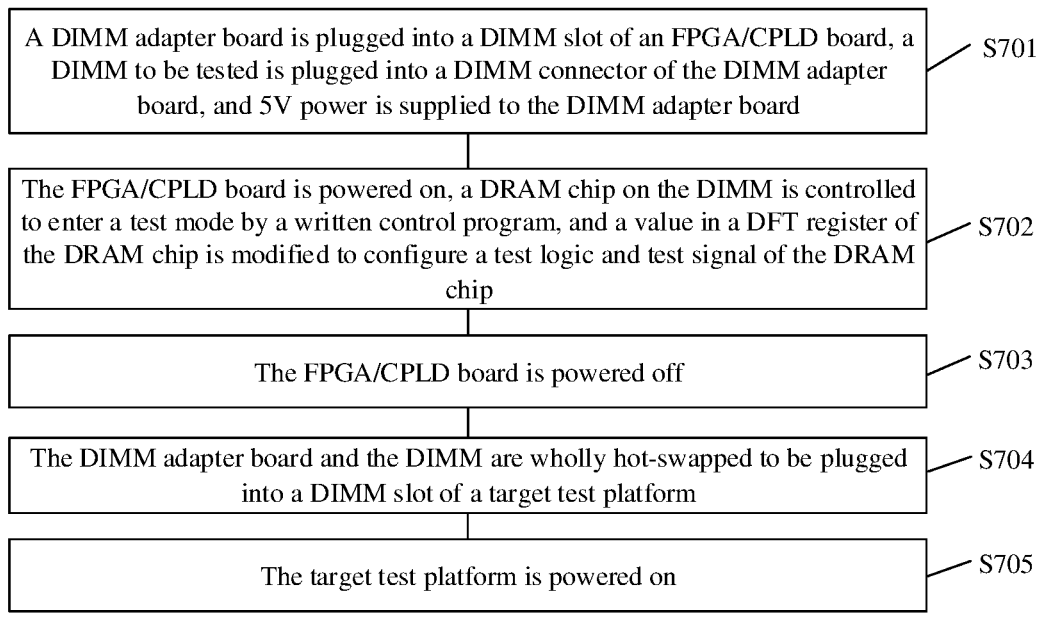
FIG. 7B is a flowchart for implementing a test method according to an embodiment of the disclosure.

FIG. 7B is a flowchart for implementing a test method according to an embodiment of the disclosure. As shown in FIG. 7B, the method includes the following operations S701 to S705.

In S701, a DIMM adapter board is plugged into a DIMM slot of an FPGA/CPLD board, a DIMM to be tested is plugged into a DIMM connector of the DIMM adapter board, and 5V power is supplied to the DIMM adapter board.

In S702, the FPGA/CPLD board is powered on, a DRAM chip on the DIMM is controlled to enter a test mode by a written control program, and a value in a DFT register of the DRAM chip is modified to configure a test logic and test signal of the DRAM chip.

In S703, the FPGA/CPLD board is powered off.

In S704, the DIMM adapter board and the DIMM are wholly hot-swapped to be plugged into a DIMM slot of a target test platform. The target test platform may be, for example, a x86 mainboard.

In S705, the target test platform is powered on. After the target test platform is powered on, the configuration made to the test mode of the DIMM in S702 may not be lost since the power and reset signals of the DIMM are not provided by the target test platform.

In the embodiment of the disclosure, the DIMM may be controlled to enter the test mode of the DRAM chip and tested in the target test platform, which contributes to improving the flexibility and accuracy of testing the DIMM and facilitates the test of the DIMM on various types of system platforms. Therefore, problems of the DIMM may be analyzed rapidly and accurately.

Figure 8:
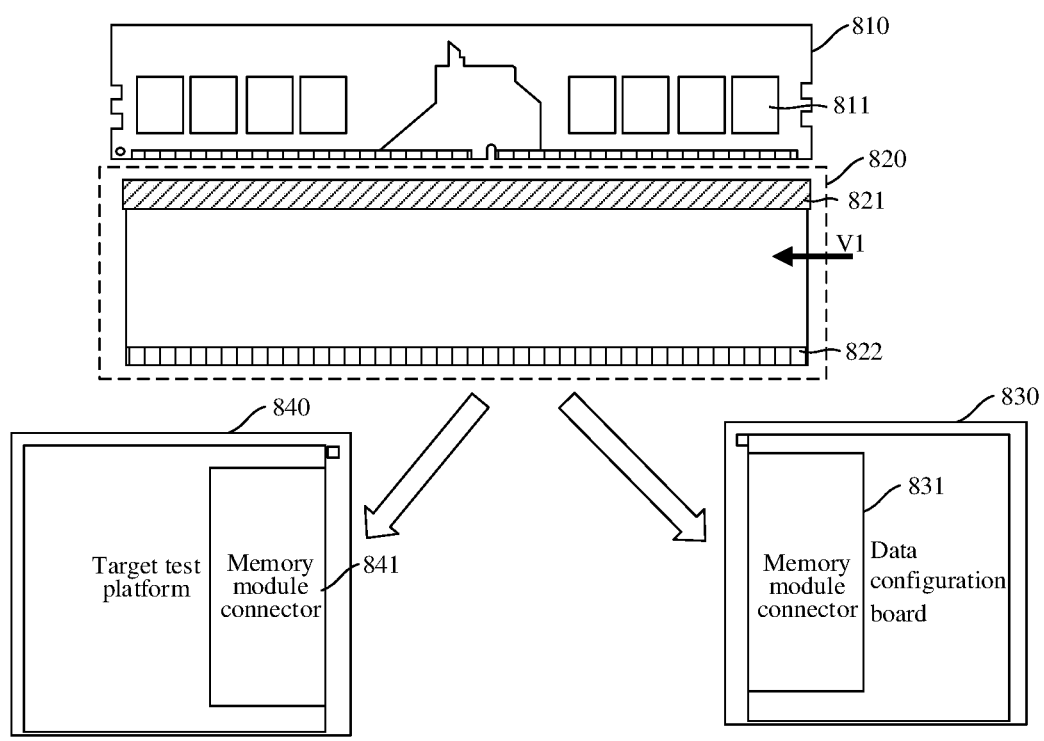
FIG. 8 is a schematic diagram of a composition structure of a test system according to an embodiment of the disclosure.

An embodiment of the disclosure provides a test system. FIG. 8 is a schematic diagram of a composition structure of a test system according to an embodiment of the disclosure. As shown in FIG. 8, the test system 800 includes a memory module to be tested 810, a board adapter device 820, a data configuration board 830, and a target test platform 840.

The memory module to be tested 810 is connected to a connector 821 of the board adapter device 820.

The data configuration board 830 is configured to control, through the board adapter device 820, a DRAM chip 811 on the memory module 810 to enter a test mode when a gold finger 822 of the board adapter device 820 is connected to a memory module connector 831 of the data configuration board 830, a power input signal V1 is connected to the board adapter device 820 and the data configuration board 820 is powered on.

The target test platform 840 is configured to test the memory module 810 when the DRAM chip 811 on the memory module 810 enters the test mode and the board adapter device 820 connected to the memory module 810 is hot-swapped from being connected to the memory module connector 831 of the data configuration board 830 to being connected to a memory module connector 841 of the target test platform 840.

Here, the board adapter device 820 may be the board adapter device as described in any one of the above-mentioned embodiments.

In some embodiments, the board adapter device is further configured to be connected to a DC power supply providing a preset voltage value through a second transmission structure.

In some embodiments, the data configuration board is further configured to configure, through the board adapter device, a test logic and test signal of the DRAM chip on the memory module. The target test platform is further configured to test the memory module based on the test logic and test signal of the DRAM chip.

It is to be noted that the descriptions about the above system embodiment are similar to those about the method embodiments described above, and beneficial effects similar to those of the method embodiments are achieved. Technical details not disclosed in the system embodiment of the disclosure can be understood with reference to the descriptions about the method embodiments of the disclosure.

Figure 9:
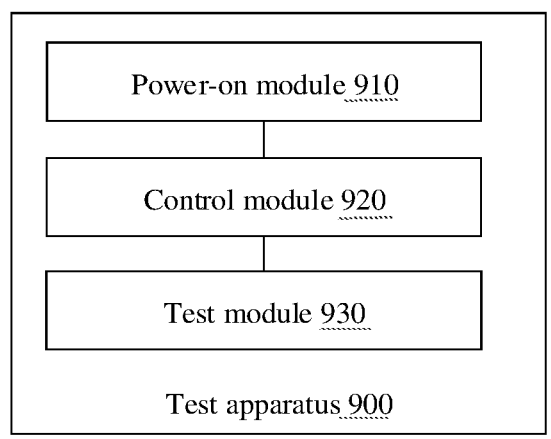
FIG. 9 is a schematic diagram of a composition structure of a test apparatus according to an embodiment of the disclosure.

FIG. 9 is a schematic diagram of a composition structure of a test apparatus according to an embodiment of the disclosure. As shown in FIG. 9, the test apparatus 900 includes a power-on module 910, a control module 920, and a test module 930.

The power-on module 910 is configured to control a data configuration board to be powered on when the gold finger of the board adapter device as described in any one of the above-mentioned embodiments is connected to a memory module connector of the data configuration board and the board adapter device receives a power input signal, the connector of the board adapter device being connected to a memory module to be tested.

The control module 920 is configured to control, by the data configuration board through the board adapter device, a DRAM chip on the memory module to enter a test mode.

The test module 930 is configured to test, by a target test platform, the memory module when the DRAM chip on the memory module enters the test mode and the board adapter device connected to the memory module is hot-swapped from being connected to the memory module connector of the data configuration board to being connected to a memory module connector of the target test platform.

In some embodiments, the test apparatus further includes a power input module, configured to input the power input signal to the board adapter device when the connector of the board adapter device is connected to the memory module and the gold finger of the board adapter device is connected to the memory module connector of the data configuration board.

In some embodiments, the power input module is further configured to connect the second transmission structure of the board adapter device with a DC power supply providing a preset voltage value.

In some embodiments, the test apparatus further includes a connecting module, configured to connect the connector of the board adapter device with the memory module, and connect the gold finger of the board adapter device with the memory module connector of the data configuration board.

In some embodiments, the test apparatus further includes a swapping module, configured to hot-swap, when the DRAM chip on the memory module enters the test module, the board adapter device connected to the memory module from being connected to the memory module connector of the data configuration board to being connected to the memory module connector of the target test platform.

In some embodiments, the test apparatus further includes a configuration module, configured to configure, by the data configuration board through the board adapter device, a test logic and test signal of the DRAM chip on the memory module. The test module is further configured to test, by the target test platform, the memory module based on the test logic and test signal of the DRAM chip.

In some embodiments, the memory module is a DIMM.

In some embodiments, the data configuration board includes one of an FPGA board and a CPLD board.

The descriptions about the above apparatus embodiment are similar to those about the method embodiments, and beneficial effects similar to those of the method embodiment are achieved. Technical details not disclosed in the apparatus embodiment of the disclosure may be understood with reference to the descriptions about the method embodiment of the disclosure.

It is to be noted that, in the embodiments of the disclosure, the test method described above may also be stored in a computer-readable storage medium when being implemented in form of a software function module and sold or used as an independent product. Based on such an understanding, the technical solutions of the embodiments of the disclosure essentially or parts making contributions to some implementations may be embodied in form of a software product. The software product is stored in a storage medium, including multiple instructions for enabling a test device (which may be a personal computer, a server, a network device, or the like) to execute all or part of the method described in each embodiment of the disclosure. The aforementioned storage medium includes various media capable of storing program codes, such as a USB disk, a mobile hard disk, a Read Only Memory (ROM), a magnetic disk, or an optical disk. Therefore, the embodiments of the disclosure are not limited to any specific combination of hardware and software.

Correspondingly, an embodiment of the disclosure provides a test device, which includes a memory and a processor. The memory stores a computer program executable by the processor. The processor is configured to execute the program to perform the steps in the method described above.

Correspondingly, an embodiment of the disclosure provides a computer-readable storage medium having stored thereon a computer program that, when executed by a processor, causes the processor to perform the steps in the methods described above. The computer-readable storage medium may be a volatile or nonvolatile storage medium.

Correspondingly, an embodiment of the disclosure provides a computer program product, which includes a non-transitory computer-readable storage medium storing a computer program. The computer program is read and executed by a computer to implement part or all of the steps in the methods described above. The computer program product may specifically be implemented by hardware, software, or a combination thereof. In an optional embodiment, the computer program product is specifically embodied as a computer storage medium. In another optional embodiment, the computer program product is specifically embodied as a software product, such as a Software Development Kit (SDK).

It is to be pointed out herein that the descriptions about the above storage medium, computer program product and device embodiments are similar to those about the methods embodiment, and beneficial effects similar to those of the methods embodiment are achieved. Technical details not disclosed in the storage medium, computer program product and device embodiments of the disclosure are understood with reference to the descriptions about the method embodiments of the disclosure.

Figure 10:
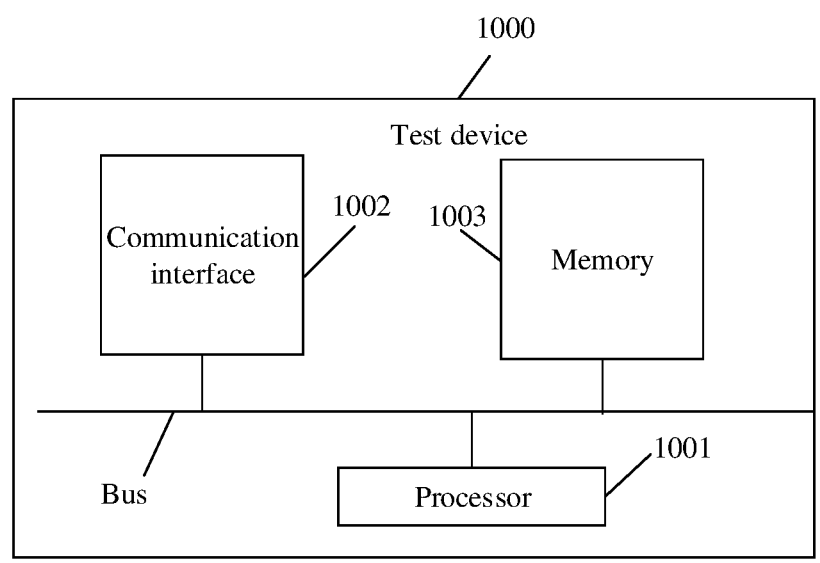
FIG. 10 is a schematic diagram of a hardware entity of a test device according to an embodiment of the disclosure.

It is to be noted that FIG. 10 is a schematic diagram of a hardware entity of a test device according to an embodiment of the disclosure. As shown in FIG. 10, the hardware entity of the test device 1000 includes a processor 1001, a communication interface 1002, and a memory 1003.

The processor 1001 generally controls overall operations of the test device 1000.

The communication interface 1002 may enable the test device to communicate with other terminals or servers through a network.

The memory 1003 is configured to store instructions and applications executable by the processor 1001, may further cache data (such as image data, audio data, voice communication data, and video communication data) to be processed or already processed by the processor 1001 and each module in the test device 1000, which may be implemented by a flash or a Random Access Memory (RAM).

It is to be understood that "one embodiment" or "an embodiment" mentioned throughout the specification means that specific features, structures, or characteristics related to an embodiment are included in at least one embodiment of the disclosure. Therefore, "in one embodiment" or "in an embodiment" mentioned throughout the specification does not necessarily refer to the same embodiment. In addition, these specific features, structures, or characteristics may be combined in any suitable manner in one or more embodiments. It is to be understood that, in various embodiments of the disclosure, the magnitude of the sequence number of each process described above does not mean an execution sequence, and the execution sequence of each process is determined by its function and inherent logic, and should not constitute any limitation on the implementation of the embodiments of the disclosure. The above sequence numbers of the embodiments of the disclosure are for descriptive purposes only and do not represent merit of the embodiments.

It is to be noted that terms "include" and "contain" or any other variant thereof are intended to cover nonexclusive inclusions herein, so that a process, method, object, or device including a series of elements includes not only those elements, but also other elements that are not explicitly listed, or further includes elements that are inherent to such a process, method, object, or device. Without further limitation, an element defined by statement "including a/an . . . " does not preclude the existence of another identical element in a process, method, object, or device including the element.

In some embodiments provided by the disclosure, it should be understood that the disclosed device and method may be implemented in other manners. The device embodiments described above are only schematic. For example, the division of the units described is only a logical functional division, and other division manners may be used during practical implementation. For example, multiple units or components may be combined or integrated into another system, or some features may be neglected or not implemented. In addition, the coupling or direct coupling or communication connection between the components shown or discussed may be indirect coupling or communication connection, implemented through some interfaces, of the devices or the units, and may be electrical, mechanical or other forms.

The units described above as separate components may or may not be physically separated. The components displayed as units may or may not be physical units. That is, they are located in the same place or distributed to multiple network units. Part or all of the units may be selected as practically required to achieve the objectives of the solutions of the embodiments.

In addition, each function unit in each embodiment of the disclosure may be integrated into a processing unit. Alternatively, each unit may serve as an independent unit. Alternatively, two or more than two units may be integrated into a unit. The integrated unit may be implemented in a hardware form, or may be implemented in form of hardware plus a software function unit.

It is understood by those of ordinary skill in the art that all or part of the operations of the method embodiments may be implemented by means of hardware associated with program instructions. The aforementioned program may be stored in a computer-readable storage medium. When the program is executed, the operations of the method embodiments are executed. The aforementioned storage medium includes various media capable of storing program codes, such as a mobile storage device, a ROM, a magnetic disk, or an optical disk.

Alternatively, the integrated unit of the disclosure may be stored in a computer-readable storage medium when being implemented in form of a software function module and sold or used as an independent product. Based on such an understanding, the technical solutions of the disclosure essentially or parts making contributions to some implementations may be embodied in form of a software product. The computer software product is stored in a storage medium, including multiple instructions for enabling a test device (which may be a personal computer, a server, a network device, or the like) to execute all or part of the method described in each embodiment of the disclosure. The aforementioned storage medium includes various media capable of storing program codes, such as a mobile hard disk, a ROM, a magnetic disk, or an optical disk.

In some examples, the terms "module" and "unit" and the like in the semiconductor memory as shown in FIG. 5 may be implemented by one or more hardware circuits/sub-circuits and/or one or more processors. In some examples, a module or unit may include one or more circuits with or without stored code or instructions. The module or unit may include one or more components that are directly or indirectly connected. These components may or may not be physically attached to, or located adjacent to, one another.

The forgoing is only the implementation modes of the disclosure and the scope of protection of the disclosure is not limited thereto. Any variations or replacements apparent to those skilled in the art within the technical scope disclosed in the disclosure shall fall within the scope of protection of the disclosure.

What is claimed is:

1. A board adapter device, comprising a first adapter structure, a second adapter structure, and a signal transmission structure, wherein
the first adapter structure is provided with a gold finger matched with a board of a target memory module;
the second adapter structure is provided with a connector matched with the gold finger;
the signal transmission structure comprises a first transmission module and a second transmission module; wherein the first transmission module is configured to connect a data signal line, a clock signal line, an address signal line, and a control signal line of the gold finger to corresponding connecting lines of the connector; and the second transmission module is configured to, in response to receiving a power input signal, convert the power input signal into a power output signal matched with a power supply of the target memory module, and transmit the power output signal to a power signal line of the connector.

2. The device of claim 1, wherein the second transmission module comprises a power interface and a power conversion unit;
the power interface is configured to be connected to an external power supply, and transmit the power input signal of the external power supply to the power conversion unit; and
the power conversion unit is connected to the power interface and the power signal line of the connector, and is configured to convert the power input signal into the power output signal matched with the power supply of the target memory module, and transmit the power output signal to the power signal line of the connector.

3. The device of claim 1, wherein the power output signal comprises a power supply voltage signal, a programmable voltage signal, and a termination voltage signal; and the second transmission module is configured to transmit the power supply voltage signal, the programmable voltage signal, and the termination voltage signal to a power supply voltage signal line, a programmable voltage signal line, and a termination voltage signal line of the connector, respectively.

4. The device of claim 1, wherein the signal transmission structure further comprises:
a third transmission unit, connected to a reset signal line of the connector and configured to generate a power-on reset signal and transmit the power-on reset signal to the reset signal line.

5. The device of claim 4, wherein the third transmission unit comprises a reset circuit, configured to generate the power-on reset signal.

6. The device of claim 1, wherein the target memory module is a Dual Inline Memory Module (DIMM).

7. A test method, comprising:
in response to determined that the gold finger of the board adapter device of claim 1 is connected, in a manner of plugging-in or direct connection, to a memory module connector of the data configuration board and the board adapter device receives a power input signal, controller a data configuration board to be powered on through the power input signal the connector of the board adapter device being connected to a memory module to be tested;
controlling, by a control program of the data configuration board through the board adapter device, a Dynamic Random Access Memory (DRAM) chip on the memory module to enter a test mode; and
testing, by a target test platform, the memory module in response to determining that the DRAM chip on the memory module enters the test mode and the board adapter device connected to the memory module is hot-swapped from being connected to the memory module connector of the data configuration board to being connected to a memory module connector of the target test platform.

8. The method of claim 7, further comprising:
inputting the power input signal to the board adapter device in response to determining that the connector of the board adapter device is connected to the memory module and the gold finger of the board adapter device is connected to the memory module connector of the data configuration board.

9. The method of claim 8, wherein inputting the power input signal to the board adapter device comprises:
connecting the second transmission structure of the board adapter device to a direct-current (DC) power supply providing a preset voltage value.

10. The method of claim 7, further comprising:
connecting the connector of the board adapter device to the memory module, and connecting the gold finger of the board adapter device to the memory module connector of the data configuration board.

11. The method of claim 7, further comprising:
hot-swapping, in response to determining that the DRAM chip on the memory module enters the test mode, the board adapter device connected to the memory module from being connected to the memory module connector of the data configuration board to being connected to the memory module connector of the target test platform.

12. The method of claim 7, further comprising:
configuring, by the data configuration board through the board adapter device, a test logic and test signal of the DRAM chip on the memory module, wherein
testing, by the target test platform, the memory module comprises:
testing, by the target test platform, the memory module based on the test logic and test signal of the DRAM chip.

13. The method of claim 7, wherein the memory module is a Dual Inline Memory Module (DIMM).

14. The method of claim 7, wherein the data configuration board comprises one of a Field Programmable Gate Array (FPGA) board and a Complex Programmable Logic Device (CPLD) board.

15. A test device, comprising a memory and a processor, wherein the memory is configured to store a computer program executable by the processor, and the processor is configured to execute the computer program to perform the method of claim 7.

16. A non-transitory computer-readable storage medium having stored thereon a computer program that, when executed by a processor, causes the processor to perform the method of claim 7.

17. A test system, comprising:
a memory module to be tested;
the board adapter device of claim 1;
a data configuration board; and
a target test platform,
wherein the memory module to be tested is connected to the connector of the board adapter device;
the data configuration board is configured to control, through a control program of the board adapter device, a Dynamic Random Access Memory (DRAM) chip on the memory module to enter a test mode, in response to determining that the gold finger of the board adapter device is connected, in a manner of plugging-in or direct connection, to a memory module connector of the data configuration board, the board adapter device receives the power input signal and the data configuration board is powered on through the power input signal; and
the target test platform is configured to test the memory module in response to determining that the DRAM chip on the memory module enters the test mode and the board adapter device connected to the memory module is hot-swapped from being connected to the memory module connector of the data configuration board to being connected to a memory module connector of the target test platform.

18. A test apparatus, comprising:
a power-on module, configured to: in response to determining that the gold finger of the board adapter device of claim 1 is connected, in a manner of plugged in or direct connection, to a memory module connector of the data configuration board and the board adapter device receives a power input signal, control a data configuration board to be powered on through the power input signal, the connector of the board adapter device being connected to a memory module to be tested;
a control module, configured to control, by the data configuration board through the board adapter device, a Dynamic Random Access Memory (DRAM) chip on the memory module to enter a test mode; and
a test module, configured to test, by a target test platform, the memory module in response to determining that the DRAM chip on the memory module enters the test mode and the board adapter device connected to the memory module is hot-swapped from being connected to the memory module connector of the data configuration board to being connected to a memory module connector of the target test platform.

* * * * *